(12) United States Patent
Kang et al.

(10) Patent No.: US 11,204,242 B2
(45) Date of Patent: Dec. 21, 2021

(54) MEASUREMENT SYSTEM

(71) Applicant: Gold Circuit Electronics Ltd., Taoyuan (TW)

(72) Inventors: Tien-Chieh Kang, Taoyuan (TW); Chih-Ming Tsai, Taoyuan (TW)

(73) Assignee: Gold Circuit Electronics Ltd., Taoyuan (TW)

( * ) Notice: Subject to any disclaimer, the term of this patent is extended or adjusted under 35 U.S.C. 154(b) by 0 days.

(21) Appl. No.: 17/009,779

(22) Filed: Sep. 2, 2020

(65) Prior Publication Data

US 2021/0356264 A1 Nov. 18, 2021

(30) Foreign Application Priority Data

May 13, 2020 (TW) ................................ 109205821

(51) Int. Cl.
| | | |
|---|---|---|
| *G01N 23/00* | (2006.01) | |
| *G01B 15/02* | (2006.01) | |
| *H05K 3/00* | (2006.01) | |
| *G01N 23/083* | (2018.01) | |

(52) U.S. Cl.
CPC ........... *G01B 15/02* (2013.01); *H05K 3/0047* (2013.01); *G01N 23/083* (2013.01)

(58) Field of Classification Search
CPC ..... G01B 15/02; H05K 3/0047; G01N 23/083
See application file for complete search history.

(56) References Cited

U.S. PATENT DOCUMENTS

| | | | | |
|---|---|---|---|---|
| 6,834,117 B1 * | 12/2004 | Rao | ......................... | G01N 23/04 382/149 |
| 2015/0015288 A1 * | 1/2015 | Ma | ...................... | G01R 1/06738 324/754.03 |
| 2016/0381844 A1 * | 12/2016 | Knox | .................. | H05K 13/0408 29/739 |
| 2020/0053880 A1 | 2/2020 | Twarog et al. | | |
| 2021/0014979 A1 * | 1/2021 | Adler | ................... | G06K 9/6267 |

FOREIGN PATENT DOCUMENTS

TW 201251555 12/2012

* cited by examiner

*Primary Examiner* — Kiho Kim
(74) *Attorney, Agent, or Firm* — JCIPRNET

(57) ABSTRACT

A measurement system is provided, including a measurement machine and a computer. The measurement machine is configured to measure a thickness T1 of a to-be-tested circuit board and a drilling depth D1 of the to-be-tested circuit board. The computer calculates a length S1 of a residual conductive portion in a back drilled hole of the to-be-tested circuit board according to a thickness T of a reference circuit board, a drilling depth D of the reference circuit board, a length S of a residual conductive portion in a back drilled hole of the reference circuit board, the thickness T1 of the to-be-tested circuit board and the drilling depth D1 of the to-be-tested circuit board.

4 Claims, 3 Drawing Sheets

MEASUREMENT SYSTEM

CROSS-REFERENCE TO RELATED APPLICATION

This application claims the priority benefit of Taiwan application serial no. 109205821, filed on May 13, 2020. The entirety of the above-mentioned patent application is hereby incorporated by reference herein and made a part of this specification.

BACKGROUND OF THE DISCLOSURE

1. Field of the Disclosure

The disclosure relates to a measurement system, and in particular, to a measurement system configured to obtain a length of a residual conductive portion in a back drilled hole.

2. Description of Related Art

In order to arrange complex circuits on the same circuit board, a multilayer circuit board is developed. The multilayer circuit board includes a plurality of dielectric layers and a plurality of conductive layers stacked alternately. In order to electrically connect at least two conductive wire layers to each other, a through hole is first formed on the multilayer circuit board, and then conductive materials (such as copper) are deposited in the through hole, that is, a conductive via is formed, so as to electrically connect the at least two conductive layers. The conductive via has a stub located below the at least two circuit layers, which impedes signal transmission. Therefore, a back drilling technique is developed to remove the stub through drilling.

Back drilling is to remove the stub of the conductive via having no connection or transmission functions, so as to avoid distortion of signal transmission. In order to avoid distortion of signal transmission, a length of a residual stub of the conductive via after back drilling needs to be less than a specified value. Generally, in order to measure the length of the residual stub of the conductive via of the multilayer circuit board, the multilayer circuit board needs to be cut apart. However, in the method, the multilayer circuit board is destroyed, and the multilayer circuit board cannot be used after being cut apart for measurement.

SUMMARY OF THE DISCLOSURE

The disclosure provides a measurement system that can obtain a length of a residual conductive portion in a back drilled hole of a to-be-tested circuit board in a non-destructive manner.

The measurement system of the disclosure includes a measurement machine and a computer. The measurement machine is configured to measure a thickness $T1$ of a to-be-tested circuit board and a drilling depth $D1$ of the to-be-tested circuit board. The computer calculates a length $S1$ of a residual conductive portion in a back drilled hole of the to-be-tested circuit board according to a thickness $T$ of a reference circuit board, a drilling depth $D$ of the reference circuit board, a length $S$ of a residual conductive portion in a back drilled hole of the reference circuit board, the thickness $T1$ of the to-be-tested circuit board, and the drilling depth $D1$ of the to-be-tested circuit board.

In an embodiment of the utility module, the computer calculates the length $S1$ of the residual conductive portion in the back drilled hole of the to-be-tested circuit board according to the following formula (1): $S1=[(T1/T)\times(D+S)]-D1$.

In an embodiment of the utility module, the measurement machine is electrically connected to the computer.

In an embodiment of the utility module, the measurement machine includes an X-ray inspection machine, a probe, or a combination thereof.

In an embodiment of the utility module, the above to-be-tested circuit board includes a first dielectric layer, a second dielectric layer, a signal layer, a first conductive layer, a second conductive layer, and a residual conductive layer. The signal layer is disposed between the first dielectric layer and the second dielectric layer. The first conductive layer is disposed between the first conductive layer and the signal layer. The second dielectric layer is disposed between the signal layer and the second conductive layer. The first dielectric layer and the second dielectric layer respectively have a first hole and a second hole. The first hole and the second hole are at least a part of the back drilled hole of the to-be-tested circuit board. The residual conductive layer is disposed on a side wall of the first hole of the first dielectric layer and a side wall of the second hole of the second dielectric layer and electrically connects the signal layer to the second conductive layer. The thickness $T1$ of the above to-be-tested circuit board is a distance from an outer surface of the first conductive layer to an outer surface of the second conductive layer. The residual conductive layer has an end point located on the side wall of the first hole of the first dielectric layer. The drilling depth $D1$ of the above to-be-tested circuit board is a distance from the outer surface of the first conductive layer to the end point of the residual conductive layer. The residual conductive portion is a part of the residual conductive layer located between the end point and the signal layer.

DESCRIPTION OF THE EMBODIMENTS

Figure 1:
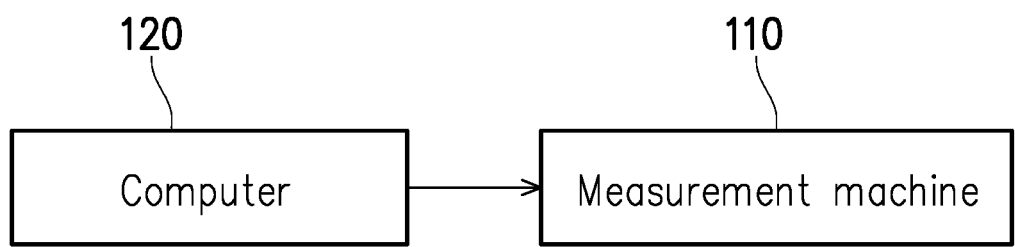
FIG. 1 is a schematic diagram of a measurement system 100 according to an embodiment of the disclosure.

FIG. 1 is a schematic diagram of a measurement system 100 according to an embodiment of the disclosure.

Figure 2:
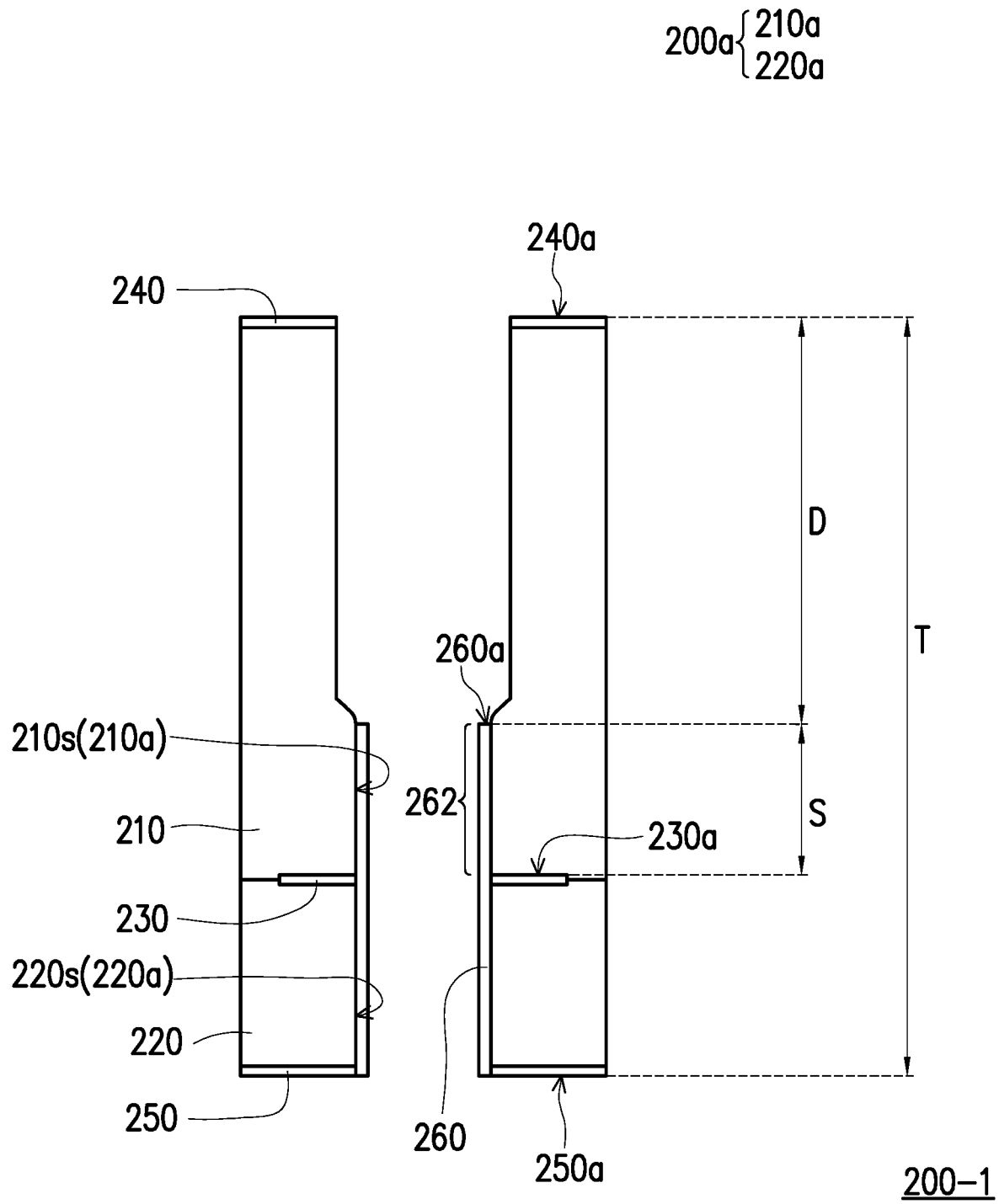
FIG. 2 is a schematic cross-sectional view of a reference circuit board 200-1 according to an embodiment of the disclosure.

FIG. 2 is a schematic cross-sectional view of a reference circuit board 200-1 according to an embodiment of the disclosure.

Figure 3:
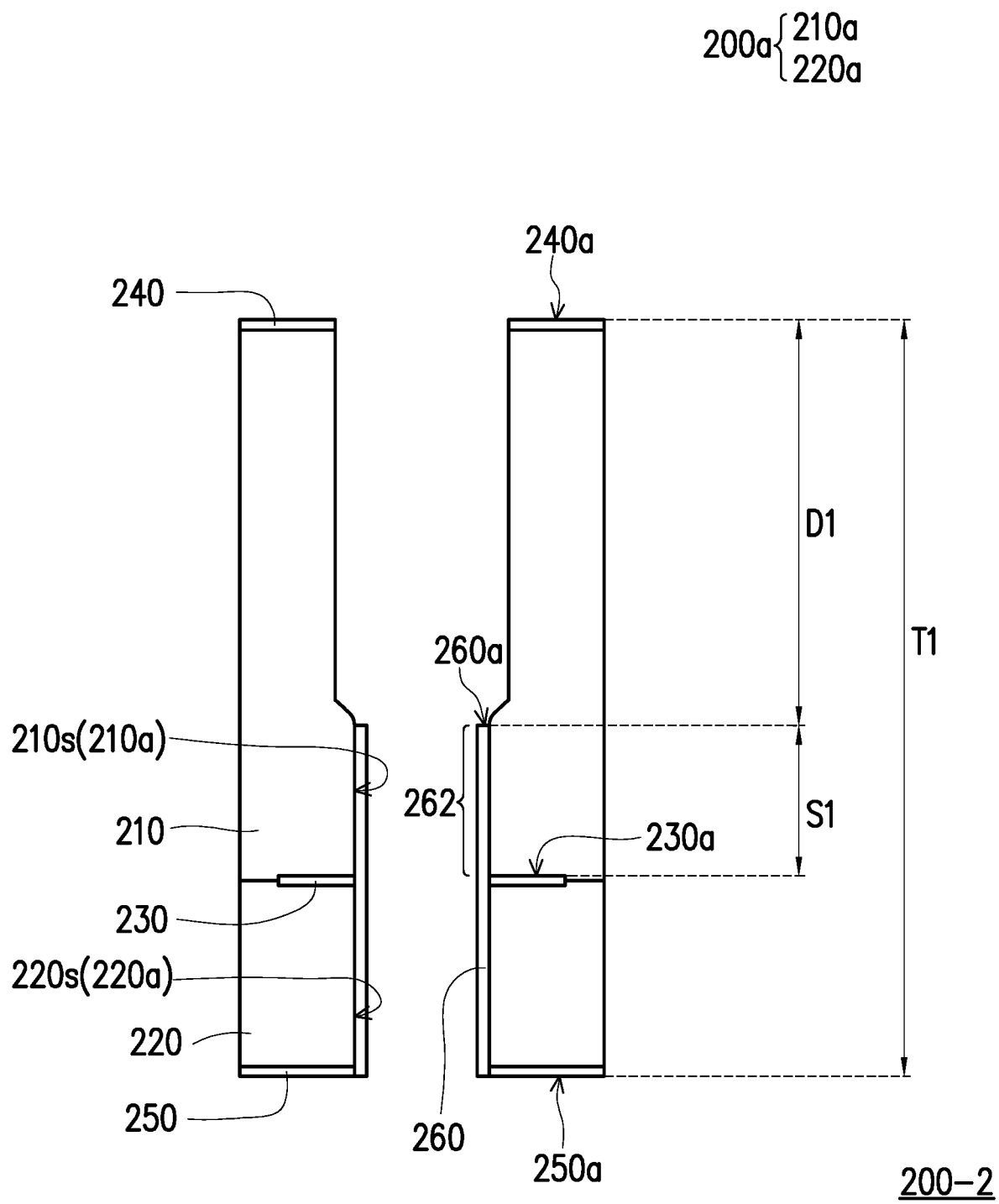
FIG. 3 is a schematic cross-sectional view of a to-be-tested circuit board 200-2 according to an embodiment of the disclosure.

FIG. 3 is a schematic cross-sectional view of a to-be-tested circuit board 200-2 according to an embodiment of the disclosure.

Referring to FIG. 1, the measurement system 100 includes a measurement machine 110 and a computer 120. Referring to FIG. 1 and FIG. 3, the measurement system 100 is adapted to obtain a length $S1$ of a residual conductive portion 262 in a back drilled hole 200a of a to-be-tested circuit board 200-2 by using a non-destructive method, which is described below with reference to the drawings.

Referring to FIG. 1 and FIG. 2, in the embodiment, before the to-be-tested circuit board 200-2 is measured, a thickness $T$ of a reference circuit board 200-1, a drilling depth $D$ of the reference circuit board 200-1, and a length $S$ of a residual conductive portion 262 in a back drilled hole 200a of the reference circuit board may be measured, and the thickness T of the reference circuit board 200-1, the drilling depth D of the reference circuit board 200-1, and the length S of the residual conductive portion 262 of the reference circuit board that are measured are input to the computer 120.

For example, in the embodiment, the reference circuit board 200-1 may be cut apart to form a cross section of the reference circuit board 200-1. The cross-section of the reference circuit board 200-1 is photographed by using an optical microscope, so as to measure the thickness T of the reference circuit board 200-1, the drilling depth D of the reference circuit board 200-1, and the length S of the residual conductive portion 262 of the reference circuit board. However, the disclosure is not limited thereto. In other embodiments, the thickness T, the drilling depth D, and the length S of the residual conductive portion 262 of the reference circuit board 200-1 may also be measured by using other methods.

Referring to FIG. 2, the reference circuit board 200-1 includes a first dielectric layer 210, a second dielectric layer 220, a signal layer 230, a first conductive layer 240, a second conductive layer 250, and a residual conductive layer 260. The signal layer 230 is disposed between the first dielectric layer 210 and the second dielectric layer 220. The first dielectric layer 210 is disposed between the first conductive layer 240 and the signal layer 230. The signal layer 230 has a surface 230a facing the first dielectric layer 210. The second dielectric layer 220 is disposed between the signal layer 230 and the second conductive layer 250. The first dielectric layer 210 and the second dielectric layer 220 respectively have a first hole 210a and a second hole 220a. The first hole 210a and the second hole 220a are at least a part of the back drilled hole 200a of the reference circuit board 200-1. The residual conductive layer 260 is disposed on a side wall 210s of the first hole 210a of the first dielectric layer 210 and a side wall 220s of the second hole 220a of the second dielectric layer 220. The residual conductive layer 260 has an end point 260a located on the side wall 210s of the first hole 210a of the first dielectric layer 210. The residual conductive layer 260 electrically connects the signal layer 230 to the second conductive layer 250. The residual conductive portion 262 of the reference circuit board 200-1 is a part of the residual conductive layer 260 located between the end point 260a and the signal layer 230.

In the embodiment, the thickness T of the above reference circuit board 200-1 is distance from an outer surface 240a of the first conductive layer 240 to an outer surface 250a of the second conductive layer 250. The drilling depth D of the above reference circuit board 200-1 is a distance from the outer surface 240a of the first conductive layer 240 to the end point 260a of the residual conductive layer 260. The length S of the residual conductive portion 262 of the above reference circuit board 200-1 is a distance from the end point 260a of the residual conductive layer 260 to the surface 230a of the signal layer 230.

Referring to FIG. 1, FIG. 2, and FIG. 3, after the thickness T, the drilling depth D, and the length S of the residual conductive portion 262 of the reference circuit board 200-1 are measured and are input to the computer 120, the measurement machine 110 of the measurement system 100 may measure a thickness T1 and a drilling depth D1 of the to-be-tested circuit board 200-2 in a non-destructive manner, and the thickness T1 and the drilling depth D1 of the to-be-tested circuit board 200-2 that are measured are input to the computer 120.

For example, in the embodiment, the measurement machine 110 may include an X-ray inspection machine. The thickness T1 and the drilling depth D1 of the to-be-tested circuit board 200-2 may be measured by using the X-ray inspection machine without damaging the to-be-tested circuit board 200-2. However, the disclosure is not limited thereto. In other embodiments, the non-destructive measurement machine 110 may also include components of other types, such as a probe, etc.

In addition, it should be noted that, in the disclosure, one component of the measurement machine 110 is not required to measure both the thickness T1 and the drilling depth D1 of the to-be-tested circuit board 200-2. In other embodiments, the measurement machine 110 may also include a plurality of different components to respectively measure the thickness T1 and the drilling depth D1 of the to-be-tested circuit board 200-2.

Referring to FIG. 3, similarly, the to-be-tested circuit board 200-2 includes a first dielectric layer 210, a second dielectric layer 220, a signal layer 230, a first conductive layer 240, a second conductive layer 250, and a residual conductive layer 260. The signal layer 230 is disposed between the first dielectric layer 210 and the second dielectric layer 220. The first dielectric layer 210 is disposed between the first conductive layer 240 and the signal layer 230. The signal layer 230 has a surface 230a facing the first dielectric layer 210. The second dielectric layer 220 is disposed between the signal layer 230 and the second conductive layer 250. The first dielectric layer 210 and the second dielectric layer 220 respectively have a first hole 210a and a second hole 220a. The first hole 210a and the second hole 220a are at least a part of the back drilled hole 200a. The residual conductive layer 260 is disposed on a side wall 210s of the first hole 210a of the first dielectric layer 210 and a side wall 220s of the second hole 220a of the second dielectric layer 220. The residual conductive layer 260 has an end point 260a located on the side wall 210s of the first hole 210a of the first dielectric layer 210. The residual conductive layer 260 electrically connects the signal layer 230 to the second conductive layer 250. A residual conductive portion 262 of the back drilled hole 200a of the to-be-tested circuit board 200-2 is a part of the residual conductive layer 260 located between the end point 260a and the signal layer 230.

In the embodiment, the thickness T1 of the above to-be-tested circuit board 200-2 is distance from an outer surface 240a of the first conductive layer 240 to an outer surface 250a of the second conductive layer 250. The drilling depth D1 of the above to-be-tested circuit board 200-2 is a distance from the outer surface 240a of the first conductive layer 240 to the end point 260a of the residual conductive layer 260.

In the embodiment, the measurement machine 110 may be electrically connected to the computer 120, so that the thickness T1 and the drilling depth D1 of the to-be-tested circuit board 200-2 that are measured by the measurement machine 110 can be automatically input to the computer 120. However, the disclosure is not limited thereto.

Referring to FIG. 1, FIG. 2, and FIG. 3, next, the computer 120 calculates the length S1 of the residual conductive portion 262 of the to-be-tested circuit board 200-2 according to the thickness T of the reference circuit board 200-1, the drilling depth D of the reference circuit board 200-1, the length S of the residual conductive portion 262 of the reference circuit board 200-1, the thickness T1 of the to-be-tested circuit board 200-2, and the drilling depth D1 of the to-be-tested circuit board 200-2. The to-be-calculated length S of the residual conductive portion 262 of the to-be-tested circuit board 200-2 is a distance from the end point 260a of the residual conductive layer 260 of the to-be-tested circuit board 200-2 to the surface 230a of the signal layer 230.

Specifically, in the embodiment, the computer 120 calculates the length S1 of the residual conductive portion 262 of the to-be-tested circuit board 200-2 according to the following formula (1): $S1=[(T1/T)\times(D+S)]-D1$. T1 is the thickness of the to-be-tested circuit board 200-2 measured by the measurement machine 110, T is the thickness of the reference circuit board 200-1, D is the drilling depth of the reference circuit board 200-1, S is the length of the residual conductive portion 262 of the reference circuit board 200-1, and D1 is the drilling depth of the to-be-tested circuit board 200-2 measured by the measurement machine 110.

Based on the above, the measurement system according to an embodiment of the disclosure calculates the length of the residual conductive portion of the to-be-tested circuit board according to the thickness of the reference circuit board, the drilling depth of the reference circuit board, the length of the residual conductive portion of the reference circuit board that are obtained in advance, and the thickness of the to-be-tested circuit board and the drilling depth of the to-be-tested circuit board that are measured by using the non-destructive measurement machine. In this way, the length of the residual conductive portion of the to-be-tested circuit board can be obtained without damaging the to-be-tested circuit board, and the to-be-tested circuit board after measurement can still be used normally, facilitating both monitoring of the length of the residual conductive portion of the to-be-tested circuit board and reduction of production costs.

What is claimed is:

1. A measurement system, comprising:
   a measurement machine configured to measure a thickness T1 of a to-be-tested circuit board and a drilling depth D1 of the to-be-tested circuit board; and
   a computer electrically connected to the measurement machine, wherein the computer calculates a length S1 of a residual conductive portion in a back drilled hole of the to-be-tested circuit board according to a thickness T of a reference circuit board, a drilling depth D of the reference circuit board, a length S of a residual conductive portion in a back drilled hole of the reference circuit board, the thickness T1 of the to-be-tested circuit board, and the drilling depth D1 of the to-be-tested circuit board;
   wherein the computer calculates the length S1 of the residual conductive portion in the back drilled hole of the to-be-tested circuit board according to the following formula (1): $S1=[(T1/T)\times(D+S)]-D1$.

2. The measurement system according to claim 1, wherein the measurement machine is electrically connected to the computer.

3. The measurement system according to claim 1, wherein the measurement machine comprises an X-ray inspection machine, a probe, or a combination thereof.

4. A measurement system, comprising:
   a measurement machine configured to measure a thickness T1 of a to-be-tested circuit board and a drilling depth D1 of the to-be-tested circuit board; and
   a computer electrically connected to the measurement machine, wherein the computer calculates a length S1 of a residual conductive portion in a back drilled hole of the to-be-tested circuit board according to a thickness T of a reference circuit board, a drilling depth D of the reference circuit board, a length S of a residual conductive portion in a back drilled hole of the reference circuit board, the thickness T1 of the to-be-tested circuit board, and the drilling depth D1 of the to-be-tested circuit board;
   wherein the to-be-tested circuit board comprises:
   a first dielectric layer and a second dielectric layer;
   a signal layer disposed between the first dielectric layer and the second dielectric layer;
   a first conductive layer, wherein the first dielectric layer is disposed between the first conductive layer and the signal layer;
   a second conductive layer, wherein the second dielectric layer is disposed between the signal layer and the second conductive layer; and
   a residual conductive layer, wherein the first dielectric layer and the second dielectric layer respectively have a first hole and a second hole, the first hole and the second hole are at least a part of the back drilled hole of the to-be-tested circuit board, the residual conductive layer is disposed on a side wall of the first hole of the first dielectric layer and a side wall of the second hole of the second dielectric layer and electrically connects the signal layer to the second conductive layer, the thickness T1 of the to-be-tested circuit board is a distance from an outer surface of the first conductive layer to an outer surface of the second conductive layer, the residual conductive layer has an end point located on the side wall of the first hole of the first dielectric layer, the drilling depth D1 of the to-be-tested circuit board is a distance from the outer surface of the first conductive layer to the end point of the residual conductive layer, and the residual conductive portion is a part of the residual conductive layer located between the end point and the signal layer.

\* \* \* \* \*